(12) United States Patent
Lee (10) Patent No.: US 11,152,335 B2
(45) Date of Patent: Oct. 19, 2021

(54) STACK PACKAGES INCLUDING A SUPPORTING SUBSTRATE

(71) Applicant: SK hynix Inc., Icheon-si (KR)

(72) Inventor: Seung Yeop Lee, Suwon-si (KR)

(73) Assignee: SK hynix Inc., Icheon-si (KR)

( * ) Notice: Subject to any disclaimer, the term of this patent is extended or adjusted under 35 U.S.C. 154(b) by 54 days.

(21) Appl. No.: 16/698,436

(22) Filed: Nov. 27, 2019

(65) Prior Publication Data
US 2020/0395340 A1 Dec. 17, 2020

(30) Foreign Application Priority Data
Jun. 17, 2019 (KR) ........................ 10-2019-0071504

(51) Int. Cl.
*H01L 25/065* (2006.01)
*H01L 23/498* (2006.01)
*H01L 23/00* (2006.01)

(52) U.S. Cl.
CPC .... *H01L 25/0657* (2013.01); *H01L 23/49816* (2013.01); *H01L 23/49822* (2013.01); *H01L 23/49838* (2013.01); *H01L 24/09* (2013.01); *H01L 24/13* (2013.01); *H01L 24/17* (2013.01); *H01L 2224/0401* (2013.01); *H01L 2224/09155* (2013.01); *H01L 2224/13006* (2013.01); *H01L 2224/17155* (2013.01); *H01L 2225/0651* (2013.01); *H01L 2225/0652* (2013.01); *H01L 2225/06506* (2013.01); *H01L 2225/06562* (2013.01)

(58) Field of Classification Search
CPC ...................................................... H01L 24/09
See application file for complete search history.

(56) References Cited

U.S. PATENT DOCUMENTS

2008/0315406 A1* 12/2008 Chung ................ H01L 25/0657
257/723
2015/0035142 A1* 2/2015 Kim ........................ H01L 23/13
257/737
2018/0315736 A1 11/2018 Ye et al.

FOREIGN PATENT DOCUMENTS

KR 1020180052351 A 5/2018

* cited by examiner

*Primary Examiner* — William A Harriston
(74) *Attorney, Agent, or Firm* — William Park & Associates Ltd.

(57) ABSTRACT

A stack package includes a supporting substrate that supports first and second semiconductor dies. The supporting substrate is disposed on a package substrate and is supported by first and second connection bumps. Redistributed line (RDL) patterns are disposed on the supporting substrate to electrically connect the first semiconductor die to the first and second connection bumps. The second semiconductor dies are connected to the package substrate by bonding wires.

20 Claims, 9 Drawing Sheets

STACK PACKAGES INCLUDING A SUPPORTING SUBSTRATE

CROSS-REFERENCE TO RELATED APPLICATIONS

The present application claims priority under 35 U.S.C 119(a) to Korean Application No. 10-2019-0071504, filed on Jun. 17, 2019, which is incorporated herein by reference in its entirety.

BACKGROUND

1. Technical Field

Embodiments of the present disclosure relate to package technologies and, more particularly, to stack packages including a supporting substrate.

2. Related Art

Recently, high performance semiconductor packages have been proposed to improve an operation speed thereof. Each of the high performance semiconductor packages may be fabricated to include a plurality of semiconductor dies which are stacked on a package substrate. A wire bonding technique may be used to electrically connect the plurality of semiconductor dies to the package substrate. As an amount of data processed by an electric system increases, it may be necessary to increase the number of input/output (I/O) terminals of the semiconductor die in order to process the data at a high speed. In such a case, advanced techniques may be required to electrically connect the I/O terminals of the semiconductor die to the package substrate.

SUMMARY

According to an embodiment, a stack package includes a package substrate, a supporting substrate mounted on the package substrate and supported by first connection bumps and second connection bumps disposed between the supporting substrate and the package substrate, a first semiconductor die disposed on a first surface of the supporting substrate to face the package substrate, first redistributed line (RDL) patterns disposed on the first surface of the supporting substrate to electrically connect the first connection bumps to the first semiconductor die, second RDL patterns disposed on the first surface of the supporting substrate to electrically connect the second connection bumps to the first semiconductor die, second semiconductor dies stacked on a second surface of the supporting substrate opposite to the first semiconductor die, third semiconductor dies stacked on the second semiconductor dies, first bonding wires electrically connected to the second semiconductor dies, and second bonding wires electrically connected to the third semiconductor dies. The package substrate includes first wire bond fingers electrically connected to the first bonding wires, second wire bond fingers electrically connected to the second bonding wires, first bump bond fingers to which the first connection bumps are electrically connected, and second bump bond fingers to which the second connection bumps are electrically connected.

According to another embodiment, a stack package includes a package substrate, a supporting substrate mounted on the package substrate and supported by first connection bumps and second connection bumps disposed between the supporting substrate and the package substrate, a first semiconductor die disposed on a first surface of the supporting substrate to face the package substrate, first redistributed line (RDL) patterns disposed on the first surface of the supporting substrate to electrically connect the first connection bumps to the first semiconductor die, second RDL patterns disposed on the first surface of the supporting substrate to electrically connect the second connection bumps to the first semiconductor die, second semiconductor dies stacked on a second surface of the supporting substrate opposite to the first semiconductor die, and bonding wires electrically connecting the second semiconductor dies to the package substrate.

DETAILED DESCRIPTION OF THE EMBODIMENTS

The terms used herein may correspond to words selected in consideration of their functions in the embodiments, and the meanings of the terms may be construed to be different according to ordinary skill in the art to which the embodiments belong. If defined in detail, the terms may be construed according to the definitions. Unless otherwise defined, the terms (including technical and scientific terms) used herein have the same meaning as commonly understood by one of ordinary skill in the art to which the embodiments belong.

It will be understood that although the terms "first," "second," "third" etc. may be used herein to describe various elements, these elements should not be limited by these terms. These terms are only used to distinguish one element from another element, but not used to define a single element or to imply a particular sequence or number of elements.

It will also be understood that when an element or layer is referred to as being "on," "over," "below," "under," or "outside" another element or layer, the element or layer may be in direct contact with the other element or layer, or intervening elements or layers may be present. Other words used to describe the relationship between elements or layers should be interpreted in a like fashion (e.g., "between" versus "directly between" or "adjacent" versus "directly adjacent").

Spatially relative terms, such as "beneath," "below," "lower," "above," "upper," "top," "bottom" and the like, may be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, when the device in the figures is turned over, elements described as below and/or beneath other elements or features would then be oriented above the other elements or features. The device may be otherwise oriented (rotated 90 degrees or at other orientations) and the spatially relative descriptors used herein interpreted accordingly.

A stack package may correspond to a semiconductor package, and the semiconductor package may include electronic devices such as semiconductor chips or semiconductor dies. The semiconductor chips or the semiconductor dies may be obtained by separating a semiconductor substrate such as a wafer into a plurality of pieces using a die sawing process. The semiconductor chips may correspond to memory chips, logic chips, or application specific integrated circuits (ASIC) chips. The memory chips may include dynamic random access memory (DRAM) circuits, static random access memory (SRAM) circuits, NAND-type flash memory circuits, NOR-type flash memory circuits, magnetic random access memory (MRAM) circuits, resistive random access memory (ReRAM) circuits, ferroelectric random access memory (FeRAM) circuits or phase change random access memory (PcRAM) circuits which are integrated on the semiconductor substrate. The semiconductor package may be employed in communication systems such as mobile phones, electronic systems associated with biotechnology or health care, or wearable electronic systems. The semiconductor packages may be applicable to internet of things (IoT).

Same reference numerals refer to same elements throughout the specification. Even though a reference numeral is not mentioned or described with reference to a drawing, the reference numeral may be mentioned or described with reference to another drawing. In addition, even though a reference numeral is not shown in a drawing, it may be mentioned or described with reference to another drawing.

Figure 1:
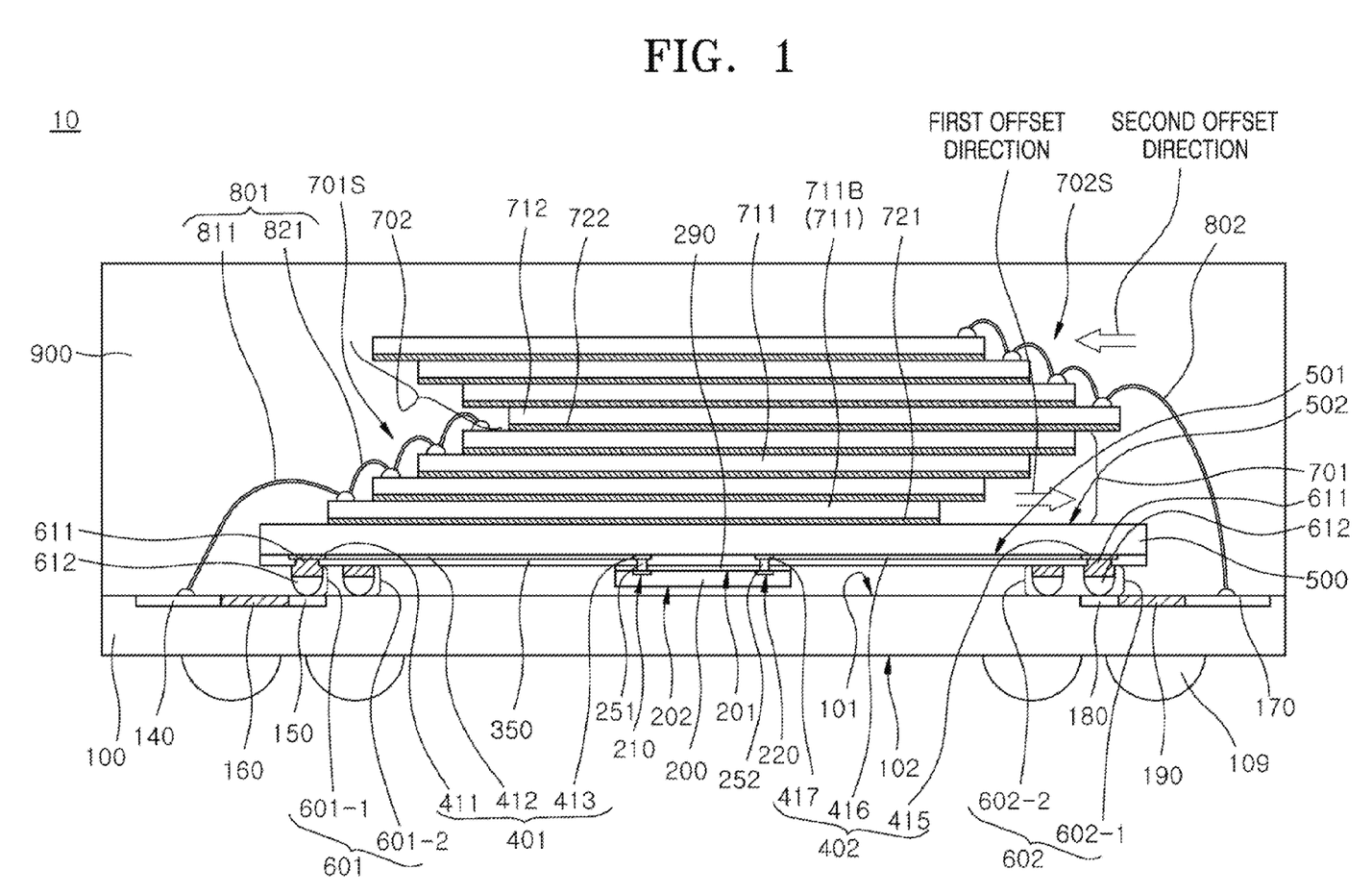
FIG. 1 is a cross-sectional view illustrating a stack package according to an embodiment.

FIG. 1 is a cross-sectional view illustrating a stack package 10 according to an embodiment.

Referring to FIG. 1, the stack package 10 may be configured to include a package substrate 100, a supporting substrate 500, a first semiconductor die 200, and a plurality of second semiconductor dies 711. The stack package 10 may further include first and second redistributed line (RDL) patterns 401 and 402 disposed on the supporting substrate 500. The stack package 10 may further include a plurality of first bonding wires 801 and a plurality of second bonding wires 802.

The plurality of second semiconductor dies 711 may be vertically stacked to constitute a first stack 701. A plurality of third semiconductor dies 712 may be additionally stacked on the first stack 701. The plurality of third semiconductor dies 712 may be vertically stacked to constitute a second stack 702. The second stack 702 may be stacked on the first stack 701.

The supporting substrate 500 may be mounted on the package substrate 100 using a plurality of first connection bumps 601 and a plurality of second connection bumps 602. The supporting substrate 500 may be supported by the first connection bumps 601 and the second connection bumps 602. The first and second connection bumps 601 and 602 may be located to be laterally spaced apart from the first semiconductor die 200. The supporting substrate 500 may have a first surface 501 and an opposing second surface 502. The supporting substrate 500 may be a member supporting the second semiconductor dies 711 and the third semiconductor dies 712. The first semiconductor die 200 may be attached to the supporting substrate 500. The supporting substrate 500 may be a substrate in which no interconnection structures, conductive patterns, or integrated circuits exist. The supporting substrate 500 may be an insulation substrate or a semiconductor substrate such as a silicon substrate. The supporting substrate 500 may be a substrate composed of a rigid material to support the second semiconductor dies 711 and the third semiconductor dies 712.

The stack package 10 may further include an encapsulating layer 900 that is disposed on the package substrate 100 to cover and protect the supporting substrate 500, the first stack 701, and the second stack 702. The encapsulating layer 900 may include any one of various encapsulating materials. For example, the encapsulating layer 900 may include a package molding material such as an epoxy molding compound (EMC) material.

The package substrate 100 may include an interconnection structure electrically connecting the stack package 10 to an external device. The package substrate 100 may be a printed circuit board (PCB). The supporting substrate 500 may be disposed on a first surface 101 of the package substrate 100, and outer connectors 109 may be disposed on a second surface 102 of the package substrate 100 opposite to the supporting substrate 500. The outer connectors 109 may include connection members which are capable of being connected to an external device. For example, the outer connectors 109 may include solder balls.

First wire bond fingers 140 and second wire bond fingers 170 may be disposed on the first surface 101 of the package substrate 100. The first wire bond fingers 140 and the second wire bond fingers 170 may be disposed on two opposite end portions of the package substrate 100. That is, the first wire bond fingers 140 may be disposed on the first surface 101 of a first end portion of the package substrate 100, and the second wire bond fingers 170 may be disposed on the first surface 101 of a second end portion of the package substrate 100 opposite to the first end portion. The first wire bond fingers 140 may be disposed on the first end portion of the package substrate 100 to be adjacent to a first end portion of the supporting substrate 500, and the second wire bond fingers 170 may be disposed on the second end portion of the package substrate 100 to be adjacent to a second end portion of the supporting substrate 500. The first wire bond fingers 140 and the second wire bond fingers 170 may be disposed at both sides of a portion of the package substrate 100, which overlaps with the supporting substrate 500, respectively. Accordingly, the first wire bond fingers 140 may be separated from the second wire bond fingers 170 by a central region of the package substrate 100 overlapping with the supporting substrate 500.

The first bonding wires 801 may be electrically connected to the first wire bond fingers 140, respectively. The second bonding wires 802 may be electrically connected to the second wire bond fingers 170, respectively. The first bonding wires 801 may electrically connect the second semiconductor dies 711 of the first stack 701 to the first wire bond fingers 140. The second bonding wires 802 may electrically connect the third semiconductor dies 712 of the second stack 702 to the second wire bond fingers 170. The first bonding wires 801 may be disposed at a first side of the first stack 701, and the second bonding wires 802 may be disposed at a second side of the first stack 701 opposite to the first bonding wires 801.

The second semiconductor dies 711 may be sequentially stacked to be offset to provide a first step structure 701S. For example, the second semiconductor dies 711 may be sequentially stacked to be offset in a first offset direction directed from the first wire bond fingers 140 toward the second wire bond fingers 170. The second semiconductor dies 711 may be stacked to reveal their edge portions to which the first bonding wires 801 are connected. The second semiconductor dies 711 may be attached to and stacked on the supporting substrate 500 using a first adhesive layer 721.

The third semiconductor dies 712 may be sequentially stacked to be offset to provide a second step structure 702S. For example, the third semiconductor dies 712 may be sequentially stacked to be offset in a second offset direction directed from the second wire bond fingers 170 toward the first wire bond fingers 140. The second offset direction may be opposite to the first offset direction. The third semiconductor dies 712 may be stacked to reveal their edge portions to which the second bonding wires 802 are connected. The third semiconductor dies 712 may be attached to and stacked on the first stack 701 using a second adhesive layer 722.

The first bonding wires 801 may include first sub-bonding wires 811 electrically connecting the first wire bond fingers 140 of the package substrate 100 to a second bottommost semiconductor die 711B corresponding to a bottommost die of the first stack 701. The second bottommost semiconductor die 711B may be a semiconductor die which is closest to the package substrate 100 among the second semiconductor dies 711. The first surface 501 of the supporting substrate 500 may face the package substrate 100, and the second surface 502 of the supporting substrate 500 may face the second bottommost semiconductor die 711B. The first bonding wires 801 may further include second sub-bonding wires 821 electrically connecting the second semiconductor dies 711 to each other. The first sub-bonding wires 811 may be electrically connected to the second sub-bonding wires 821.

The second bonding wires 802 may electrically connect the second bond fingers 170 to the second stack 702 including the third semiconductor dies 712 and may extend to electrically connect the third semiconductor dies 712 to each other.

First bump bond fingers 150 and second bump bond fingers 180 may be disposed on the first surface 101 of the package substrate 100. The first bump bond fingers 150 may be electrically connected to the first wire bond fingers 140. The first bump bond fingers 150 may be electrically connected to the first wire bond fingers 140 through first interconnection lines 160 disposed on the first surface 101 of the package substrate 100. The second bump bond fingers 180 may be electrically connected to the second wire bond fingers 170 through second interconnection lines 190 disposed on the first surface 101 of the package substrate 100.

The first connection bumps 601 may be physically and mechanically bonded to and electrically connected to the first bump bond fingers 150, respectively. The second connection bumps 602 may be physically and mechanically bonded to and electrically connected to the second bump bond fingers 180, respectively. The first and second connection bumps 601 and 602 may be formed of substantially the same connection member. For example, each of the first and second connection bumps 601 and 602 may be configured to include a bump body 611 and a conductive adhesive layer 612. The bump body 611 may be formed to include a metal material such as a copper material, and the conductive adhesive layer 612 may be formed to include a solder layer. The bump bodies 611 of the first and second connection bumps 601 and 602 may be connected to the supporting substrate 500, and the conductive adhesive layers 612 of the first and second connection bumps 601 and 602 may be connected to the first and second bump bond fingers 150 and 180.

The first and second connection bumps 601 and 602 may support the supporting substrate 500, and the supporting substrate 500 may be spaced apart from the first surface 101 of the package substrate 100 by a distance. The first semiconductor die 200 may be disposed on the first surface 101 of the package substrate 100. The first semiconductor die 200 may be disposed such that a second surface 202 of the first semiconductor die 200 faces the first surface 101 of the package substrate 100. The first semiconductor die 200 may also have a first surface 201 facing the supporting substrate 500. The first and second connection bumps 601 and 602 may lift the supporting substrate 500 to provide space between the supporting substrate 500 and the package substrate 100 for the first semiconductor die 200 located between the supporting substrate 500 and the package substrate 100.

A plurality of first die pads 210 and a plurality of second die pads 220 may be disposed on the first surface 201 of the first semiconductor die 200. The first and second die pads 210 and 220 may be connection pads for electrically connecting the first semiconductor die 200 to the supporting substrate 500. The first semiconductor die 200 may be disposed on a central portion of the package substrate 100. That is, the first semiconductor die 200 may be located between an edge portion including the first wire bond fingers 140 and another edge portion including the second wire bond fingers 170.

The first semiconductor die 200 may electrically connect the second semiconductor dies 711 of the first stack 701 to the third semiconductor dies 712 of the second stack 702. The first semiconductor die 200 may be configured to include a controller that controls operations of the second semiconductor dies 711 of the first stack 701 and operations of the third semiconductor dies 712 of the second stack 702. The second semiconductor dies 711 of the first stack 701 and the third semiconductor dies 712 of the second stack 702 may be memory semiconductor dies storing data. The second semiconductor dies 711 of the first stack 701 and the third semiconductor dies 712 of the second stack 702 may be memory semiconductor dies that supply the data to the first semiconductor die 200 or store the data generated by a control operation of the first semiconductor die 200. The second semiconductor dies 711 and the third semiconductor dies 712 may be non-volatile memory devices such as NAND-type flash memory devices.

Figure 2:
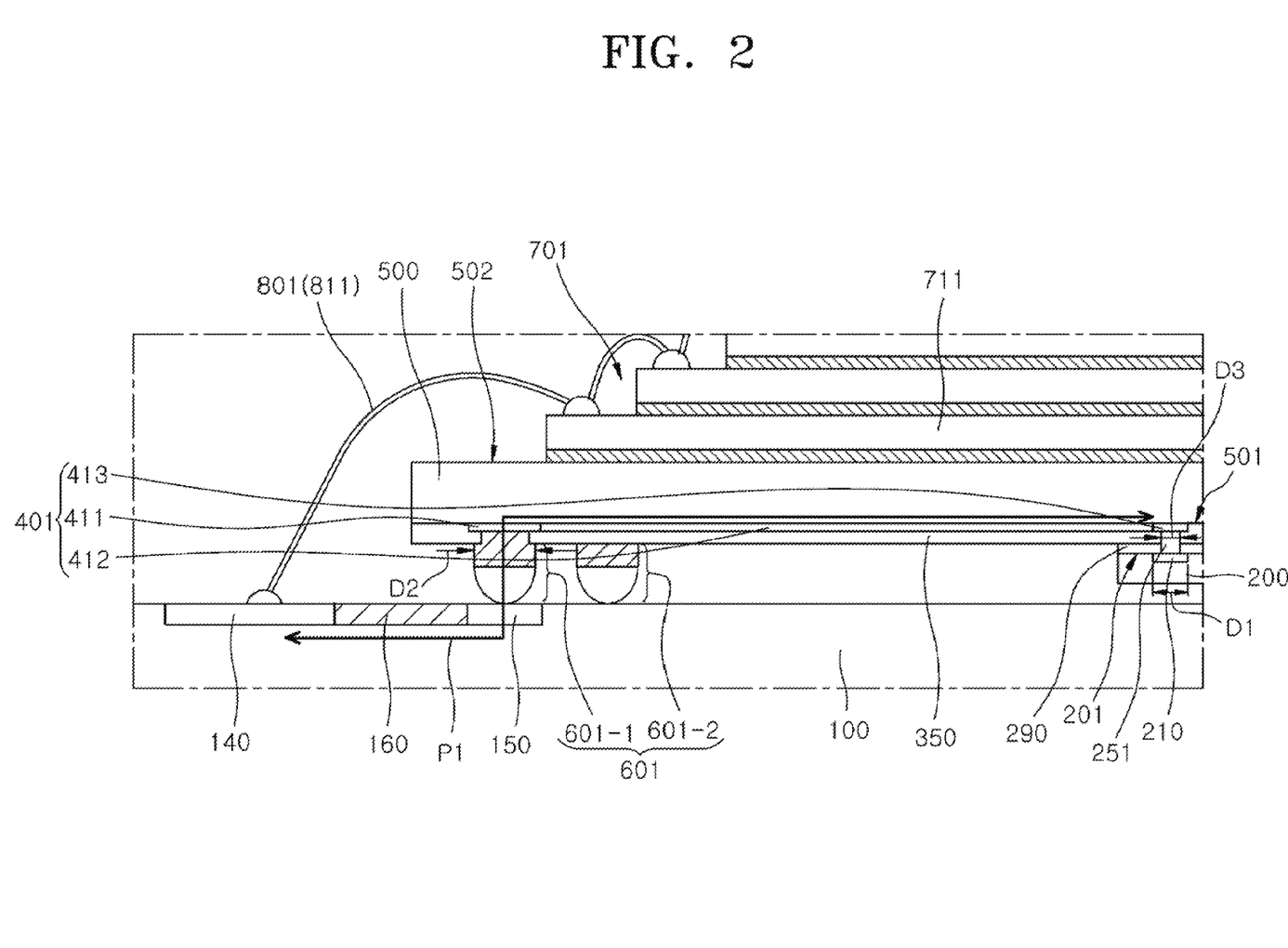
FIGS. 2 and 3 are enlarged cross-sectional views illustrating portions of the stack package shown in FIG. 1.
Figure 3:
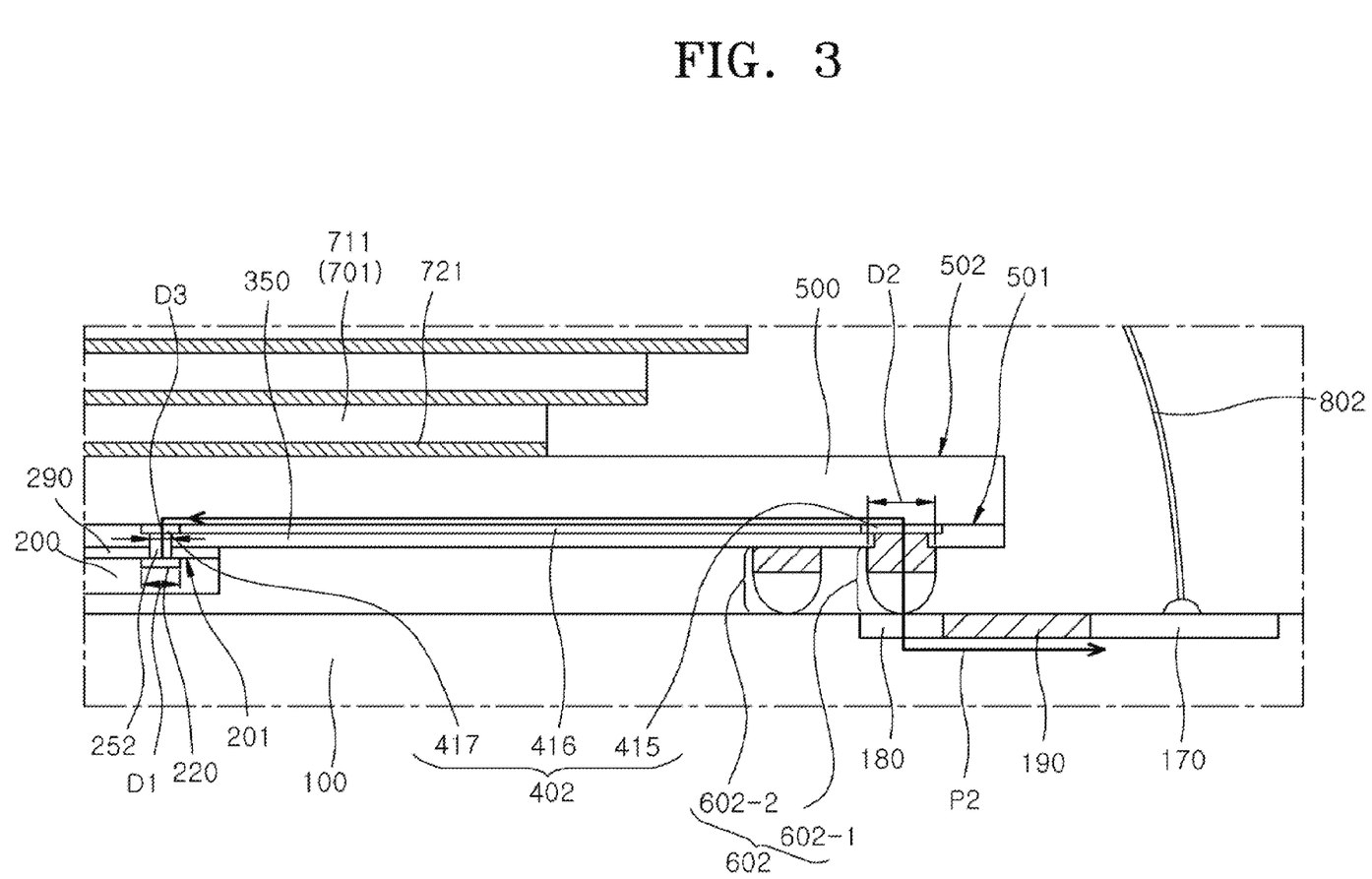

FIGS. 2 and 3 are enlarged cross-sectional views illustrating portions (including portions of the supporting substrate 500) of the stack package 10 shown in FIG. 1.

Referring to FIGS. 1 and 2, the first semiconductor die 200 may be electrically connected to the second semiconductor dies 711 of the first stack 701 through the first die pads 210 of the first semiconductor die 200, first inner bumps 251, the first RDL patterns 401, the first connection bumps 601, the first bump bond fingers 150, the first interconnection lines 160, the first wire bond fingers 140, and the first bonding wires 801. As such, the first RDL patterns 401, the first connection bumps 601, the first bump bond fingers 150, the first interconnection lines 160, the first wire bond fingers 140, and the first bonding wires 801 may provide a first channel for communication between the first semiconductor die 200 and the second semiconductor dies 711.

Referring to FIGS. 1 and 3, the first semiconductor die 200 may be electrically connected to the third semiconductor dies 712 of the second stack 702 through the second die pads 220 of the first semiconductor die 200, second inner bumps 252, the second RDL patterns 402, the second connection bumps 602, the second bump bond fingers 180, the second interconnection lines 190, the second wire bond fingers 170, and the second bonding wires 802. As such, the second RDL patterns 402, the second connection bumps 602, the second bump bond fingers 180, the second interconnection lines 190, the second wire bond fingers 170, and the second bonding wires 802 may provide a second channel for communication between the first semiconductor die 200 and the third semiconductor dies 712. The first semiconductor die 200 may communicate with the second and third semiconductor dies 711 and 712 through a plurality of channels (i.e., the first and second channels) at the same time. Thus, an operation speed of the stack package 10 may be improved.

Referring again to FIGS. 1 and 2, the first RDL patterns 401 may electrically connect the first semiconductor die 200 to the first connection bumps 601. The first RDL patterns 401 may be disposed on the first surface 501 of the supporting substrate 500. First ends of the first RDL patterns 401 may be electrically connected to the first inner bumps 251, and the first RDL patterns 401 may extend such that second ends of the first RDL patterns 401 are electrically connected to the first connection bumps 601. The first RDL patterns 401 may be formed of a metal layer. The first RDL patterns 401 may include a copper material or an aluminum material. Each of the first RDL patterns 401 may be a conductive pattern including a first portion 411, a first extension portion 412, and a second portion 413. The first portions 411 of the first RDL patterns 401 may be lands to which the first connection bumps 601 are connected. The first portions 411 of the first RDL patterns 401 may be disposed on the first surface 501 of the supporting substrate 500 and may be laterally spaced apart from the first semiconductor die 200. The second portions 413 of the first RDL patterns 401 may be disposed to vertically overlap with the first die pads 210 of the first semiconductor die 200 and may be electrically connected to the first die pads 210 through the first inner bumps 251. The first extension portions 412 of the first RDL patterns 401 may be line-shaped patterns electrically connecting the first portions 411 to the second portions 413.

Referring again to FIGS. 1 and 3, the second RDL patterns 402 may extend in an opposite direction of a direction in which the first RDL patterns 401 extend from the first semiconductor die 200. The second RDL patterns 402 may be disposed on the first surface 501 of the supporting substrate 500 and may extend toward the second connection bumps 602. The second RDL patterns 402 may electrically connect the first semiconductor die 200 to the second connection bumps 602. Each of the second RDL patterns 402 may be a conductive pattern including a third portion 415, a second extension portion 416, and a fourth portion 417. The third portions 415 of the second RDL patterns 402 may be lands to which the second connection bumps 602 are connected. The third portions 415 of the second RDL patterns 402 may be disposed on the first surface 501 of the supporting substrate 500 and may be laterally spaced apart from the first semiconductor die 200. The fourth portions 417 of the second RDL patterns 402 may be disposed to vertically overlap with the second die pads 220 of the first semiconductor die 200 and may be electrically connected to the second die pads 220 through the second inner bumps 252. The second extension portions 416 of the second RDL patterns 402 may be line-shaped patterns electrically connecting the third portions 415 to the fourth portions 417.

Referring FIGS. 2 and 3, a dielectric layer 350 may be disposed on the first surface 501 of the supporting substrate 500 to electrically isolate and insulate the first and second RDL patterns 401 and 402 from each other. The dielectric layer 350 may include a solder resist layer. An inner adhesive layer 290 may be disposed between the first surface 201 of the first semiconductor die 200 and the dielectric layer 350. The first semiconductor die 200 may be attached to the supporting substrate 500 by the inner adhesive layer 290. The inner adhesive layer 290 may include a dielectric material such as an underfill material or a non-conductive film (NCF).

The first and second inner bumps 251 and 252 may be connection members electrically connecting the first semiconductor die 200 to the first and second RDL patterns 401 and 402. The first and second inner bumps 251 and 252 may have a relatively small diameter to be in contact with the first and second die pads 210 and 220 having a relatively small diameter D1. The first and second inner bumps 251 and 252 may have a diameter D3 which is less than a diameter D2 of the first and second connection bumps 601 and 602.

Referring to FIG. 2, first electrical paths P1 may be provided to include the first die pads 210, the first inner bumps 251, the first RDL patterns 401, the first connection bumps 601, the first bump bond fingers 150, the first interconnection lines 160, and the first wire bond fingers 140. Referring to FIG. 3, second electrical paths P2 may be provided to include the second die pads 220, the second inner bumps 252, the second RDL patterns 402, the second connection bumps 602, the second bump bond fingers 180, the second interconnection lines 190, and the second wire bond fingers 170. One of the first electrical paths P1 may be disposed to have substantially the same length as any one of the second electrical paths P2.

In an embodiment, one of the first RDL patterns 401 may be formed to have substantially the same length as any one of the second RDL patterns 402. The first RDL patterns 401 may have a symmetric layout to the second RDL patterns 402 with respect to the first semiconductor die 200 in a plan view. In such a case, the first die pads 210 of the first semiconductor die 200 may also be symmetric to the second die pads 220 of the first semiconductor die 200 with respect to a straight line (i.e., centerline) passing through a central point of the first semiconductor die 200 when viewed from a plan view.

The first bump bond fingers 150, the first interconnection lines 160, and the first wire bond fingers 140 may have substantially the same lengths and shapes as the second bump bond fingers 180, the second interconnection lines 190, and the second wire bond fingers 170, respectively. The first bump bond fingers 150, the first interconnection lines 160, and the first wire bond fingers 140 may be disposed to be symmetric to respective ones of the second bump bond fingers 180, the second interconnection lines 190, and the second wire bond fingers 170 with respect to the first semiconductor die 200 when viewed from a plan view.

As a result of the layout described above, it may be possible to effectively reduce a difference in length between a path connecting the first semiconductor die 200 to the second semiconductor dies 711 of the first stack 701 and a path connecting the first semiconductor die 200 to the third semiconductor dies (712 of FIG. 1) of the second stack (702 of FIG. 1). The path connecting the first semiconductor die 200 to the second semiconductor dies 711 may be provided to have substantially the same length as the path connecting the first semiconductor die 200 to the third semiconductor dies (712 of FIG. 1) of the second stack (702 of FIG. 1). Thus, the first semiconductor die 200 may access the second semiconductor dies 711 and the third semiconductor dies 712 with substantially the same signal routing length or a similar signal routing length, thereby improving signal integrity of the stack package 10.

Figure 4:
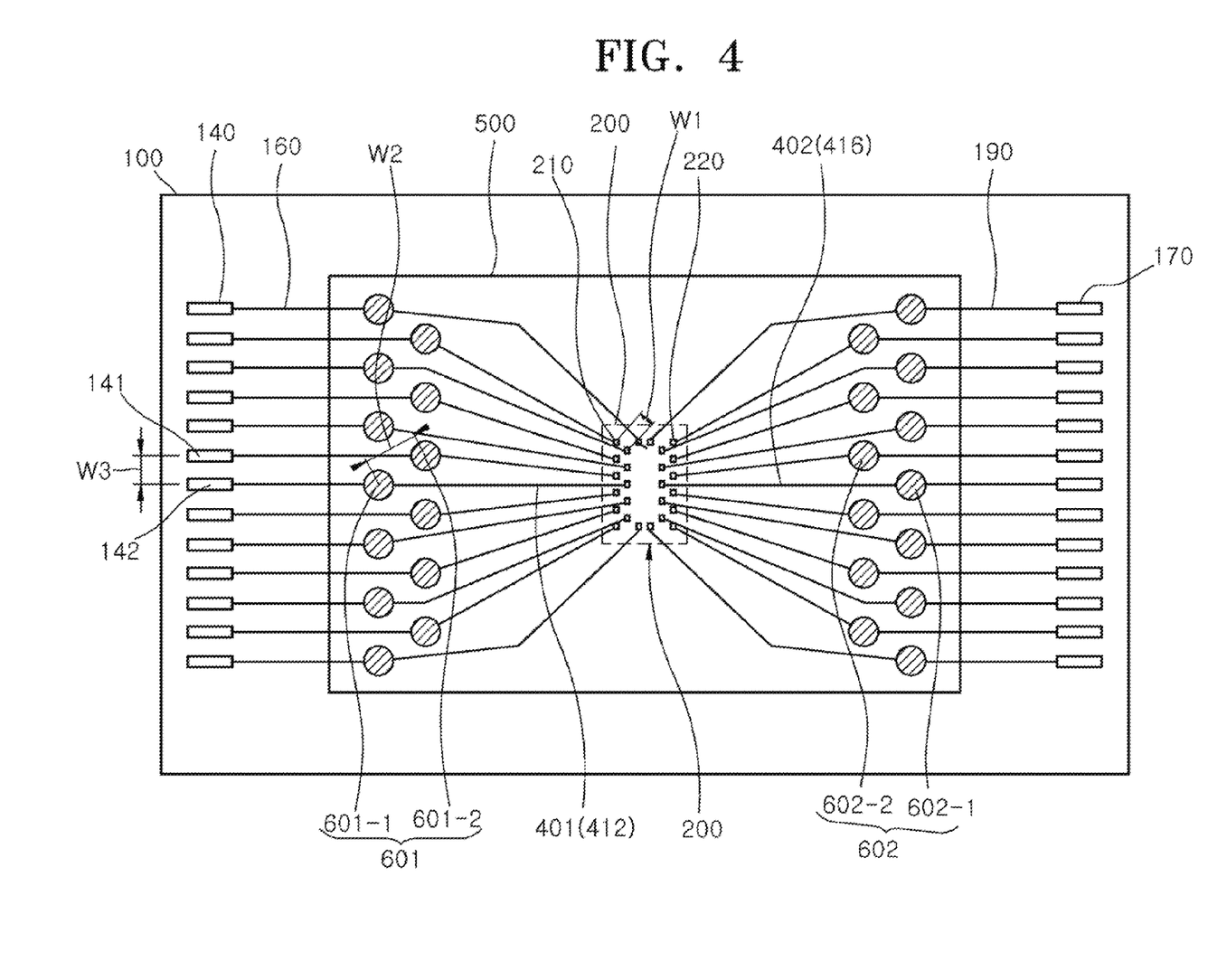
FIG. 4 is a plan view illustrating wire bond fingers, connection bumps, and die pads of the stack package shown in FIG. 1.
Figure 5:
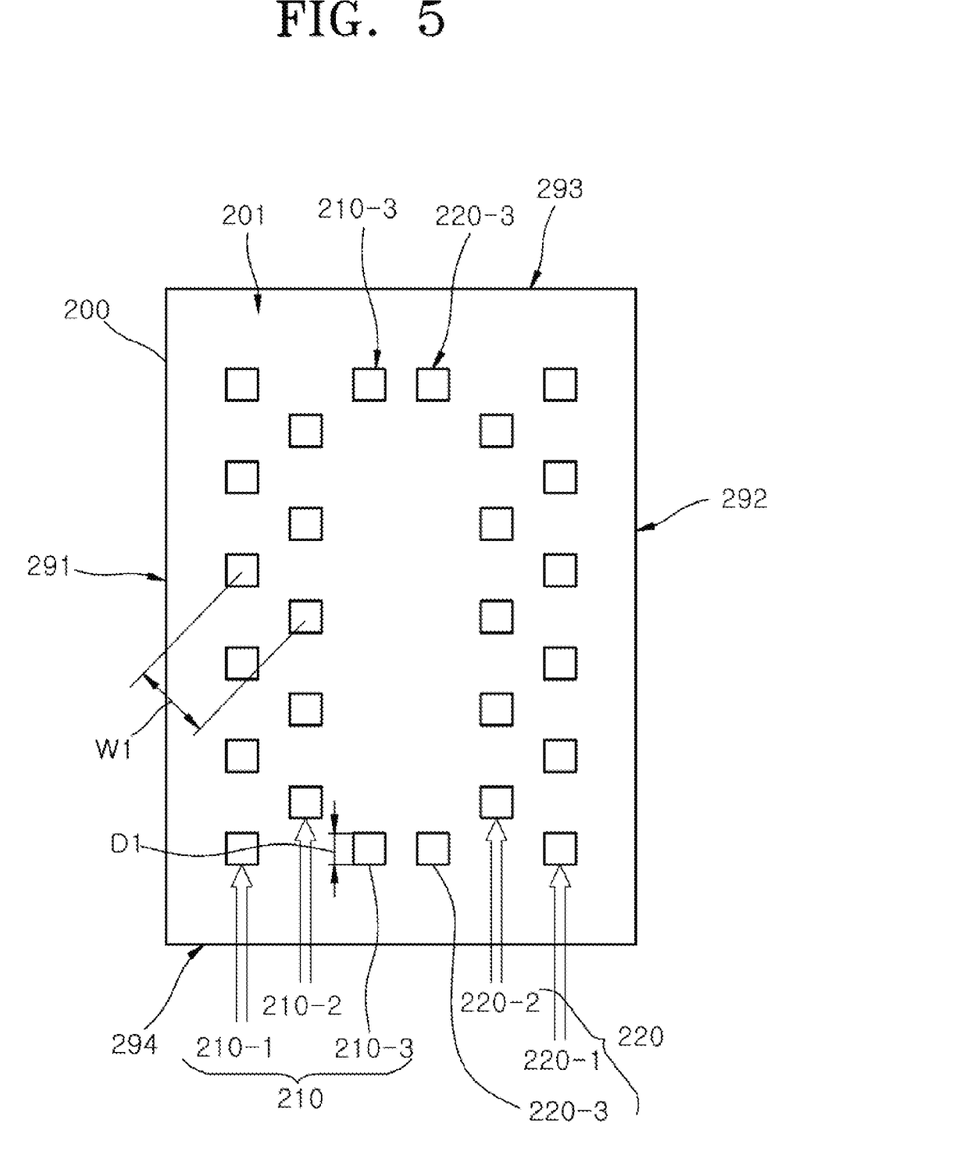
FIG. 5 is an enlarged plan view illustrating the die pads shown in FIG. 4.
Figure 6:
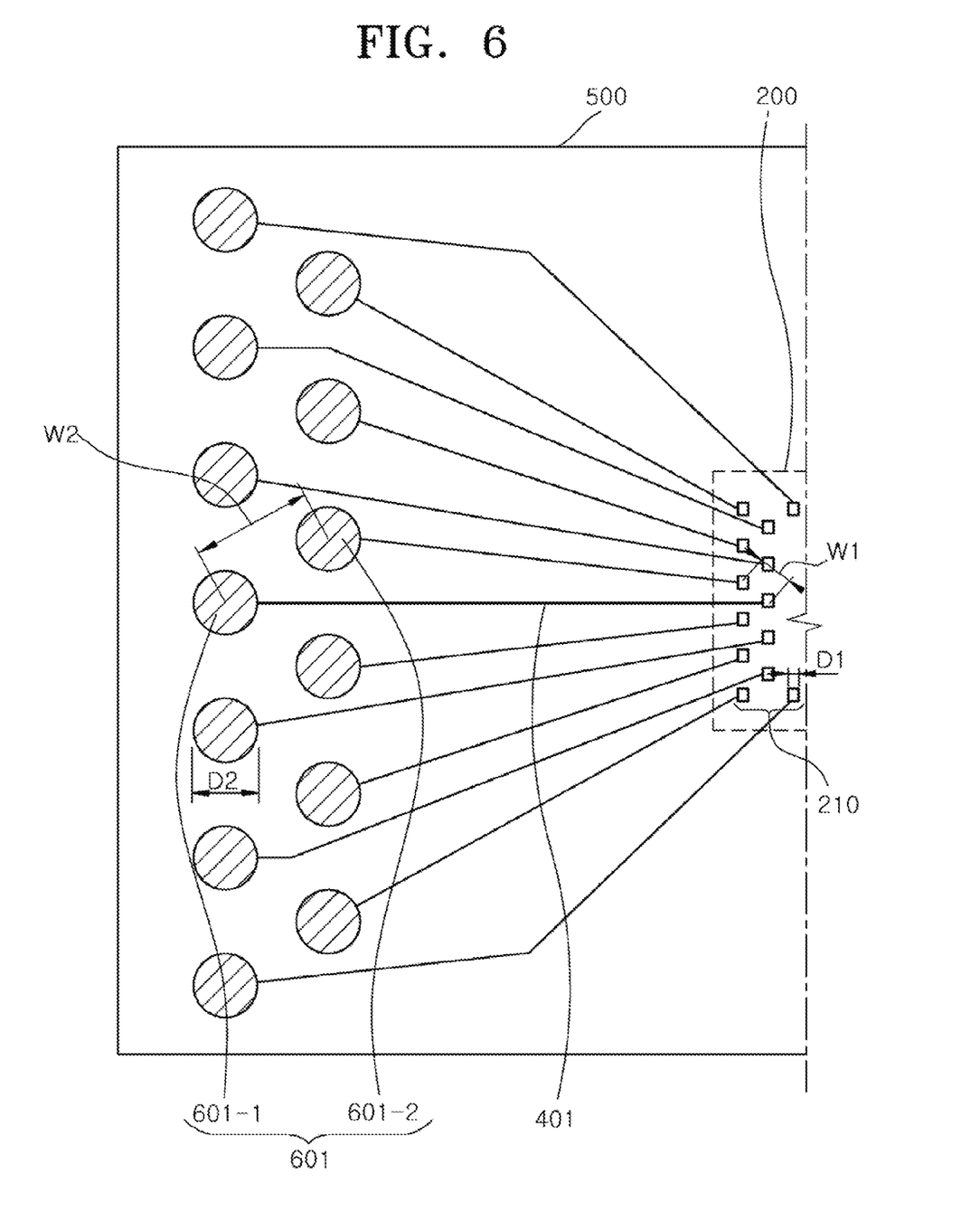
FIG. 6 is a plan view illustrating the connection bumps and the die pads shown in FIG. 4.

FIG. 4 is a plan view illustrating the first and second wire bond fingers 140 and 170, the first and second connection bumps 601 and 602, and the first and second die pads 210 and 220 of the stack package 10 shown in FIG. 1. FIG. 5 is an enlarged plan view illustrating the first and second die pads 210 and 220 of the first semiconductor die 200 shown in FIG. 4. FIG. 6 is a plan view focusing on the first connection bumps 601 and the first die pads 210 of FIG. 4.

Referring to FIGS. 1 and 4, the first semiconductor die 200 may have a relatively small size or a small width as compared with the second semiconductor dies 711 and the third semiconductor dies 712. In order that the first semiconductor die 200 having a relatively small size is disposed below the first stack 701 including the second semiconductor dies 711, the first semiconductor die 200 may be provided to be attached to a bottom surface of the supporting substrate 500. The first wire bond fingers 140 may be arrayed in a column on a first portion of the package substrate 100 where the supporting substrate 500 is mounted. The second wire bond fingers 170 may be arrayed in a column on a second portion of the package substrate 100 opposite to the first portion on which the first wire bond fingers 140 are arrayed. The column in which the first wire bond fingers 140 are arrayed and the column in which the second wire bond fingers 170 are arrayed may be substantially symmetric to the first semiconductor die 200 in a plan view.

The supporting substrate 500 may be mounted on the package substrate 100 using the first and second connection bumps 601 and 602. The first and second connection bumps 601 and 602 may be disposed between the package substrate 100 and the supporting substrate 500. The first connection bumps 601 and the second connection bumps 602 may be disposed to be symmetric to the first semiconductor die 200 when viewed from a plan view.

The first RDL patterns 401 connecting the first connection bumps 601 to the first die pads 210 of the first semiconductor die 200 may be disposed on the supporting substrate 500. The second RDL patterns 402 connecting the second connection bumps 602 to the second die pads 220 of the first semiconductor die 200 may be disposed on the supporting substrate 500.

The first interconnection lines 160 connecting the first wire bond fingers 140 to the first connection bumps 601 may be disposed on the package substrate 100. The second interconnection lines 190 connecting the second wire bond fingers 170 to the second connection bumps 602 may be disposed on the package substrate 100.

In general, input/output (I/O) terminals of a semiconductor die may be disposed on a surface of an activation layer in which discrete devices (e.g., MOS transistors) are formed. When the I/O terminals are formed on the surface 201 of the first semiconductor die 200, the number of the I/O terminals which are capable of being disposed on the surface 201 of the first semiconductor die 200 may be limited according to a limited planar area of the surface 201 of the first semiconductor die 200. In order that the first semiconductor die 200 functions as a controller controlling operations of the second and third semiconductor dies 711 and 712, the first semiconductor die 200 has to be electrically connected to the second and third semiconductor dies 711 and 712.

Referring to FIGS. 1, 4 and 5, notwithstanding that the first semiconductor die 200 has a limited area of the surface 201 on which I/O terminals are disposed and the number of I/O terminals are increasing, it may be necessary to electrically connect the first semiconductor die 200 to the second and third semiconductor dies 711 and 712. According to an embodiment, a first path connecting the first semiconductor die 200 to the second semiconductor dies 711 and a second path connecting the first semiconductor die 200 to the third semiconductor dies 712 may be independently provided to constitute a plurality of channels. Alternatively, the second semiconductor dies 711 may be signally connected to the first semiconductor die 200 through at least two channels, and the third semiconductor dies 712 may be signally connected to the first semiconductor die 200 through at least two channels. As such, if a plurality of channels are established between the first semiconductor die 200 and the second and third semiconductor dies 711 and 712, the number of the I/O terminals of the first semiconductor die 200 may significantly increase.

As the number of the I/O terminals necessary for the first semiconductor die 200 increases, the number of the first and second die pads 210 and 220 corresponding to the I/O terminals may also increases. Meanwhile, as the fabrication techniques of semiconductor devices are developed, the semiconductor devices have been formed to be smaller with the same function or even more complicated function. In such a case, as a size of the first semiconductor die 200 is reduced, a planar area of the surface 201 of the first semiconductor die 200 may also be reduced. In order to increase the number of the first and second die pads 210 and 220 disposed on a limited area, the first and second die pads 210 and 220 may be disposed to have a loop pattern along four edges of the first semiconductor die 200. In an embodiment, the first and second die pads 210 and 220 or some of the first and second die pads 210 and 220 may be arrayed in at least two columns along the edges of the first semiconductor die 200. Some of the first and second die pads 210 and 220 may be arrayed in two columns along the edges of the first semiconductor die 200 in a zigzag pattern.

In an exemplary embodiment, the first semiconductor die 200 may have two opposed edges, for example, a first edge 291 and a second edge 292. In such a case, a first group of the first die pads 210-1 may be arrayed in a first column on an edge region adjacent to the first edge 291 of the first semiconductor die 200. A second group of the first die pads 210-2 may be arrayed in a second column adjacent to the first column located opposite to the first edge 291. In addition, a first group of the second die pads 220-1 may be arrayed in a third column on an edge region adjacent to the second edge 292 of the first semiconductor die 200. A second group of the second die pads 220-2 may be arrayed in a fourth column adjacent to the third column located opposite to the second edge 292. The first semiconductor die 200 may further include two additional opposed edges, for example, a third edge 293 and a fourth edge 294 connecting the first edge 291 to the second edge 292. In such a case, additional die pads of the first die pads 210-3 and additional die pads of the second die pads 220-3 may be arrayed on edge regions adjacent to the third and fourth edges 293 and 294. The additional die pads of the first die pads 210-3 and the additional die pads of the second die pads 220-3 are not arrayed in the first to fourth columns but arrayed along the third and fourth edges 293 and 294 to constitute a loop pattern together with the first and second groups of the first die pads 210-1 and 210-2 as well as the first and second groups of the second die pads 220-1 and 220-2.

As described above, some of the first and second die pads 210 and 220 may be arrayed in two columns along the first and second edges 291 and 292, and the remaining ones of the first and second die pads 210 and 220 may be arrayed along the third and fourth edges 293 and 294. Accordingly, the first and second die pads 210 and 220 may be arrayed to have a loop pattern or a ring shape in a plan view. Thus, even though a size of the first semiconductor die 200 is reduced, the first semiconductor die 200 may be fabricated without reducing the number of the I/O terminals. As a result, even though the first semiconductor die 200 is signally connected to the second and third semiconductor dies 711 and 712 through a plurality of channels, it may be possible to array the corresponding number of I/O terminals. In the event that an architecture of a multi-chip package such as the stack package 10 is realized to have a plurality of channels, the performance of the multi-chip package having the multi-channel architecture may be improved as compared with the multi-chip package having a single-channel architecture.

Referring to FIGS. 4, 5, and 6, the first die pads 210 may be electrically connected to the first connection bumps 601 through the first RDL patterns 401. The second die pads 220 may be electrically connected to the second connection bumps 602 through the second RDL patterns 402. A size D1 (i.e., a width) of the first and second die pads 210 and 220 of the first semiconductor die 200 may be less than a diameter D2 of the first and second connection bumps 601 and 602. As described above, because the first semiconductor die 200 may require many I/O terminals in spite of a reduction in the size of the first semiconductor die 200, it may be difficult to increase a size of the first and second die pads 210 and 220. Meanwhile, in order to mount the supporting substrate 500 on the package substrate 100, it may be necessary to stably maintain the electrical connections in the stack package 10 even though the package substrate 100 and the supporting substrate 500 are deformed during a package process of the stack package 10. Thus, a size of the first and second connection bumps 601 and 602 should be greater than a certain value. For example, the first and second die pads 210 and 220 may be formed to have the size D1 (i.e., a width) of approximately a few micrometers to approximately several tens of micrometers, and the first and second connection bumps 601 and 602 may be formed to have the diameter D2 of approximately several tens of micrometers to approximately several hundreds of micrometers. Because the size D1 of the first and second die pads 210 and 220 is relatively small, it may be difficult to directly connect the first and second die pads 210 and 220 to the first and second connection bumps 601 and 602 having the diameter D2 of a relatively large value. Thus, the first and second connection bumps 601 and 602 may be connected to the first and second die pads 210 and 220 through the first and second RDL patterns 401 and 402, respectively.

The first connection bumps 601 may be disposed along an edge of the supporting substrate 500, which is adjacent to the first wire bond fingers 140, to correspond with the respective first die pads 210. When the first die pads 210 are arrayed in two columns, the first connection bumps 601 may also be arrayed in two columns to correspond with the respective first die pads 210. The first connection bumps 601 may include a first group of the first connection bumps 601-1 and a second group of the first connection bumps 601-2. The first group of the first connection bumps 601-1 may be arrayed in a first column adjacent to an edge of the supporting substrate 500, and the second group of the first connection bumps 601-2 may be arrayed in a second column between the first column and the first semiconductor die 200. The first connection bumps 601 may be arrayed in two columns in a zigzag pattern. Thus, it may be possible to maximize or efficiently utilize a space between the first group of the first connection bumps 601-1 and the second group of the first connection bumps 601-2. The second connection bumps 602 may also be arrayed in two columns to correspond with the respective second die pads 220 which are arrayed in two columns. The second connection bumps 602 may be arrayed in two columns in a zigzag pattern. The second connection bumps 602 may include a first group of the second connection bumps 602-1 and a second group of the second connection bumps 602-2 like the first connection bumps 601.

Referring again to FIGS. 4, 5, and 6, the first connection bumps 601 may be disposed to have a second pitch W2 which is greater than a first pitch W1 of the first die pads 210. The first wire bond fingers 140 may be disposed to have a third pitch W3 which is less than the second pitch W2 of the first connection bumps 601. A first sub-wire bond finger 141 and a second sub-wire bond finger 142, which are disposed to be immediately adjacent to each other, among the first wire bond fingers 140 may be disposed to have the third pitch W3. A distance between the first sub-wire bond finger 141 and the second sub-wire bond finger 142 may be smallest among distances between the first wire bond fingers 140. Thus, the third pitch W3 may mean a minimum pitch among the pitches of the first wire bond fingers 140.

In order that the first die pads 210 are disposed to have the first pitch W1 in a limited area, the first die pads 210 may be arrayed in two columns. The first pitch W1 of the first die pads 210 arrayed in two columns may be greater than a pitch of the first die pads 210 when the first die pads 210 are arrayed in one column. Thus, when the first RDL patterns 401 connected to the first die pads 210 are formed, it may be possible to maximize distances between the first RDL patterns 401.

The first wire bond fingers 140 may be disposed to have the third pitch W3 which is greater than the first pitch W1 of the first die pads 210. Because the first wire bond fingers 140 are formed to have a scale which is different from a scale of the first die pads 210, it may be difficult to directly connect the first wire bond fingers 140 to the first die pads 210. Thus, it may be necessary to form an interconnection structure that electrically connects the first wire bond fingers 140 to the first die pads 210. The first RDL patterns 401, the first connection bumps 601, and the first interconnection lines 160 may be used as the interconnection structure for electrically connecting the first wire bond fingers 140 to the first die pads 210.

Referring to FIGS. 1 and 4, the first connection bumps 601 may be bonded to the first bump bond fingers 150 by a soldering process for the conductive adhesive layers 612. In such a case, in order to prevent the first connection bumps 601 adjacent to each other from being undesirably connected to each other due to a poor soldering process, the first connection bumps 601 may be disposed to have the second pitch W2 which is greater than the third pitch W3 of the first wire bond fingers 140. In order that the first connection bumps 601 are disposed to have the second pitch W2 corresponding to a relatively large pitch, the first group of the first connection bumps 601-1 and the second group of the first connection bumps 601-2 may be arrayed in two columns in a zigzag pattern.

Referring again to FIG. 1, the supporting substrate 500 may have a size which is greater than a size of the second bottommost semiconductor die 711B, which is corresponding to a bottommost die of the first stack 701. In an embodiment, the supporting substrate 500 may have substantially the same size as the second bottommost semiconductor die 711B of the first stack 701. The second bottommost semiconductor die 711B may correspond to the second semiconductor die 711, which is closest to the supporting substrate 500 among the second semiconductor dies 711 of the first stack 701. Because the supporting substrate 500 has the same size as the second bottommost semiconductor die 711B or has a size which is greater than a size of the second bottommost semiconductor die 711B, the second bottommost semiconductor die 711B may be disposed on the supporting substrate 500 without any overhang. Thus, the second bottommost semiconductor die 711B may be disposed to fully overlap with the supporting substrate 500. In addition, because the remaining second semiconductor dies 711 stacked on the second bottommost semiconductor die 711B are able to be disposed without any overhang, it may be possible to form a stable stack structure on the supporting substrate 500.

Figure 7:
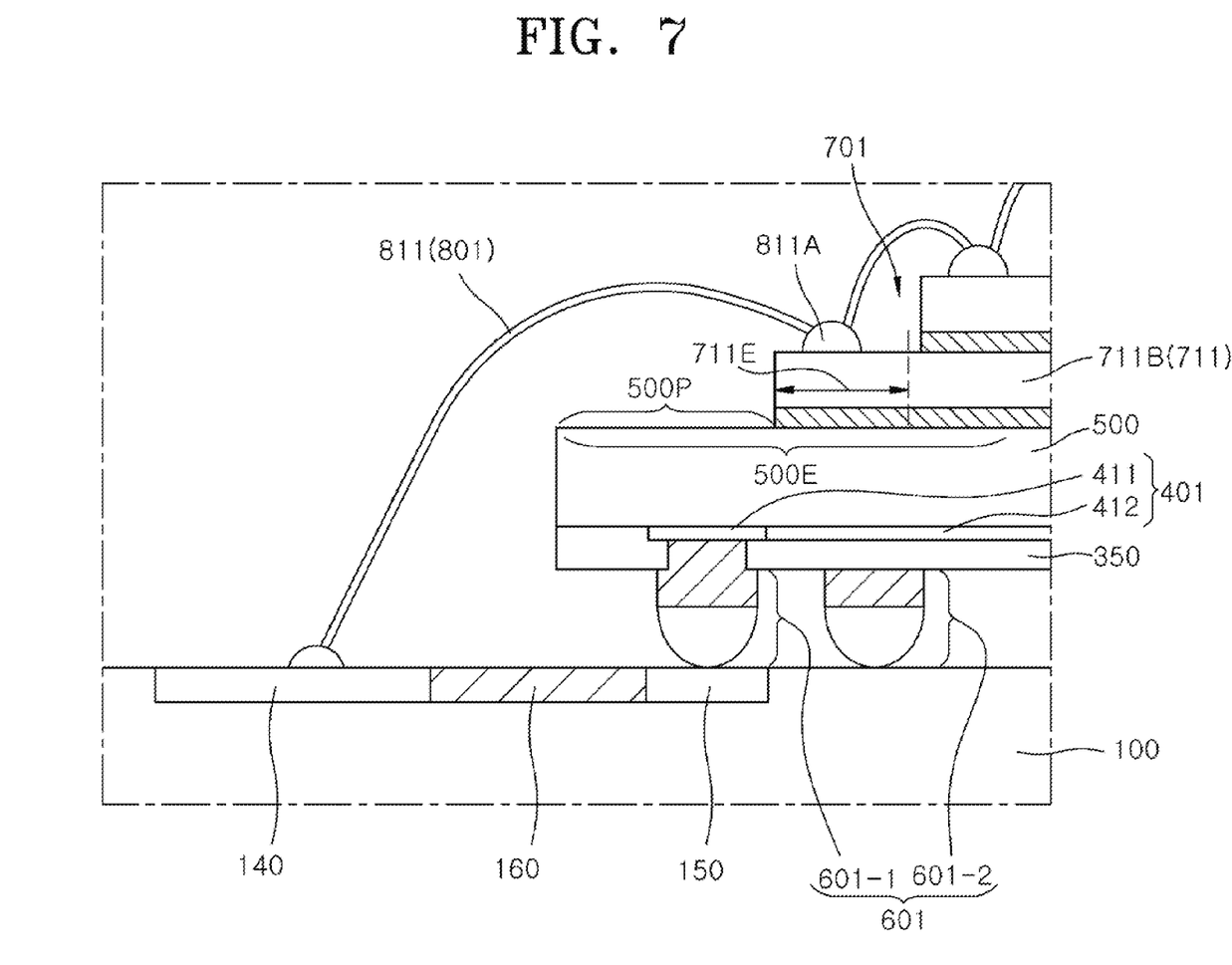
FIG. 7 is an enlarged cross-sectional view illustrating an edge portion of a supporting substrate included in a stack package according to an embodiment.

FIG. 7 is an enlarged cross-sectional view illustrating an edge portion 500E of the supporting substrate 500 included in the stack package 10 according to an embodiment.

Referring to FIG. 7, the supporting substrate 500 may be disposed on the package substrate 100 to have a protrusion 500P protruding from a side surface of the first stack 701 when viewed from a plan view. The protrusion 500P of the supporting substrate 500 may protrude from a side surface of the second bottommost semiconductor die 711B included in the first stack 701 in a plan view. The second bottommost semiconductor die 711B may be disposed on the supporting substrate 500 such that a portion of the edge portion 500E of the supporting substrate 500 protrudes from a side surface of the second bottommost semiconductor die 711B when viewed from a plan view.

The first group of the first connection bumps 601-1 among the first connection bumps 601 may be located to vertically overlap with the protrusion 500P of the supporting substrate 500. Thus, the first group of the first connection bumps 601-1 may stably support the protrusion 500P of the supporting substrate 500.

The second group of the first connection bumps 601-2 among the first connection bumps 601 may be located to vertically overlap with connection portions 811A where the first bonding wires 801 are connected to the second bottommost semiconductor die 711B closest to the supporting substrate 500 among the second semiconductor dies 711.

The second group of the first connection bumps 601-2 may be disposed to vertically overlap with an edge portion 711E of the second bottommost semiconductor die 711B. The connection portions 811A corresponding to first ends of the first sub-bonding wires 811 may be bonded to the edge portion 711E of the second bottommost semiconductor die 711B. The second group of the first connection bumps 601-2 may partially or fully overlap with the connection portions 811A of the first bonding wires 801. Thus, when the first bonding wires 801 are bonded to the second bottommost semiconductor die 711B, the second group of the first connection bumps 601-2 may support the edge portion 711E of the second bottommost semiconductor die 711B such that the supporting substrate 500 and the second bottommost semiconductor die 711B are not damaged by bonding pressure. Accordingly, the first bonding wires 801 may be more stably bonded to the second bottommost semiconductor die 711B.

In order that the second group of the first connection bumps 601-2 are located to overlap with the connection portions 811A of the first bonding wires 801, the edge portion 500E of the supporting substrate 500 may extend to overlap with the connection portions 811A of the first bonding wires 801.

Figure 8:
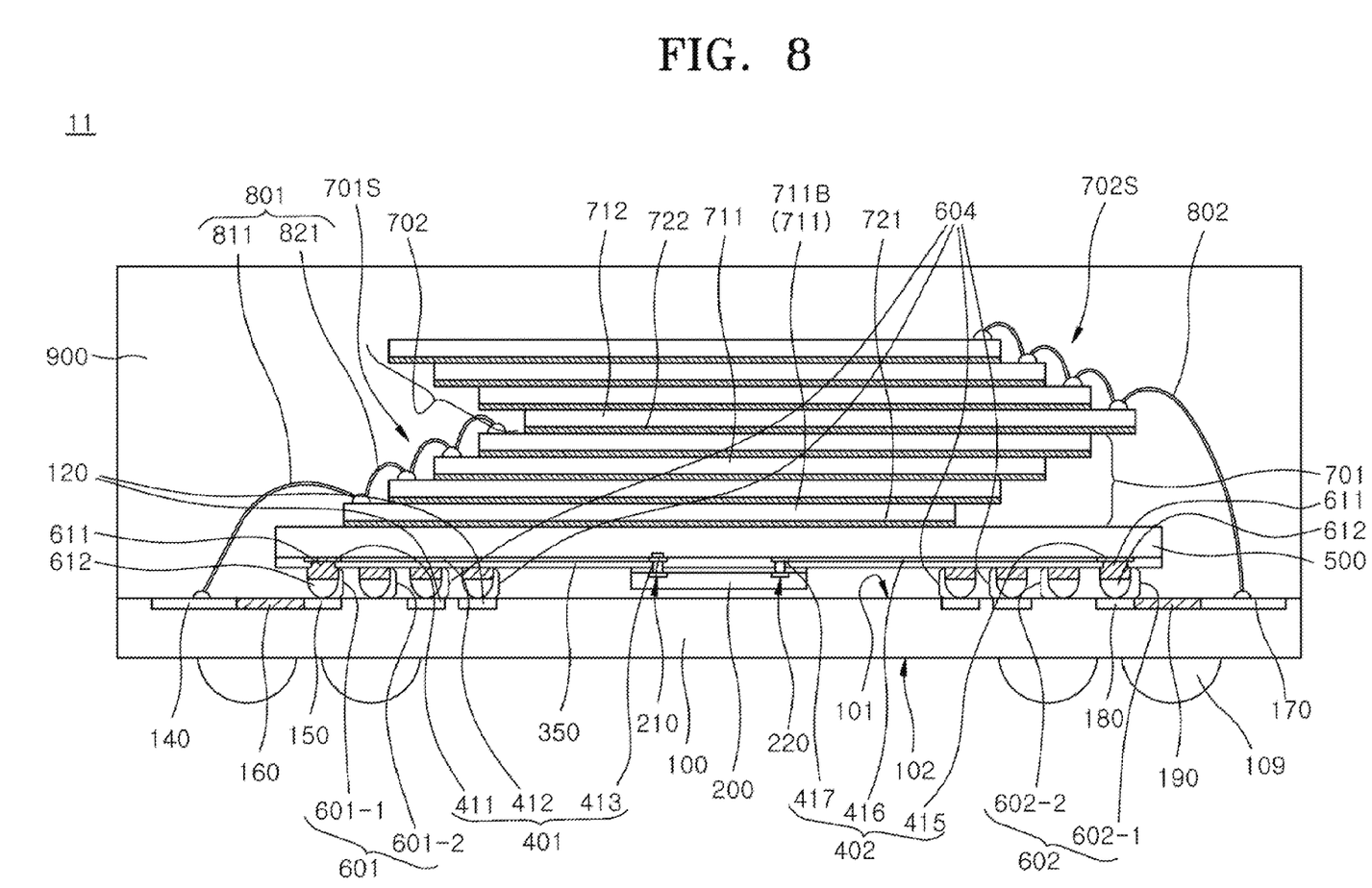
FIG. 8 is a cross-sectional view illustrating a stack package according to another embodiment.

FIG. 8 is a cross-sectional view illustrating a stack package 11 according to another embodiment. In FIG. 8, the same reference numerals as used in FIG. 1 denote the same elements.

Referring to FIG. 8, the stack package 11 may include the package substrate 100, the supporting substrate 500, the first semiconductor die 200, the first stack 701 including the second semiconductor dies 711, the second stack 702 including the third semiconductor dies 712, the first and second bonding wires 801 and 802, the first and second connection bumps 601 and 602, and the encapsulating layer 900. The second semiconductor dies 711 may be stacked on the supporting substrate 500 to provide the first step structure 701S, and the third semiconductor dies 712 may be stacked on the first stack 701 to provide the second step structure 702S. The first and second RDL patterns 401 and 402 may be disposed on the supporting substrate 500.

Dummy bumps 604 may be disposed between a position where the first connection bumps 601 are disposed and a position where the second connection bumps 602 are disposed. The dummy bumps 604 may include at least two bumps to support the supporting substrate 500. The dummy bumps 604 may be disposed on the dielectric layer 350. Because the dummy bumps 604 are disposed on the dielectric layer 350, the first and second RDL patterns 401 and 402 may be electrically insulated and isolated from the dummy bumps 604 by the dielectric layer 350. The package substrate 100 may further include dummy fingers 120 to which the dummy bumps 604 are bonded. The first dummy fingers 120 may be conductive patterns like the first wire bond fingers 140. The dummy bumps 604 may be formed to have substantially the same shape as the first connection bumps 601 or to have a similar shape to the first connection bumps 601.

The dummy bumps 604 may be disposed to vertically overlap with portions of the supporting substrate 500 and to be spaced apart from the first semiconductor die 200 in a horizontal direction. The dummy bumps 604 may be disposed to be adjacent to the first and second connection bumps 601 and 602. For example, some of the dummy bumps 604 may be disposed to be adjacent to the second group of the first connection bumps 601-2. The dummy bumps 604 disposed as described above may additionally support the second semiconductor dies 711 when the first bonding wires 801 are bonded to the second semiconductor dies 711. Accordingly, it may be possible to prevent the supporting substrate 500 from being damaged or the second semiconductor dies 711 from being bent by bonding pressure. As a result, it may be possible to effectively suppress or mitigate the occurrence of bonding failure.

The dummy bumps 604 may include at least two bumps disposed between a position where the first connection bumps 601 are disposed and a position where the second connection bumps 602 are disposed. The dummy bumps 604 may induce the encapsulating layer 900 to more readily fill a space between the supporting substrate 500 and the package substrate 100. During a molding process for forming the encapsulating layer 900, a molding material may fill the space between the supporting substrate 500 and the package substrate 100. The dummy bumps 604 may disperse the molding material to induce uniform flow of the molding material during the molding process. Accordingly, the dummy bumps 604 may prevent, suppress, or reduce the generation of voids in the space between the supporting substrate 500 and the package substrate 100 when the molding process is performed.

In an embodiment, the space between the supporting substrate 500 and the package substrate 100 may be filled with an underfill material. In such a case, the dummy bumps 604 may improve a flowability of the underfill material to lower the likelihood or prevent voids from being formed in the space between the supporting substrate 500 and the package substrate 100.

Figure 9:
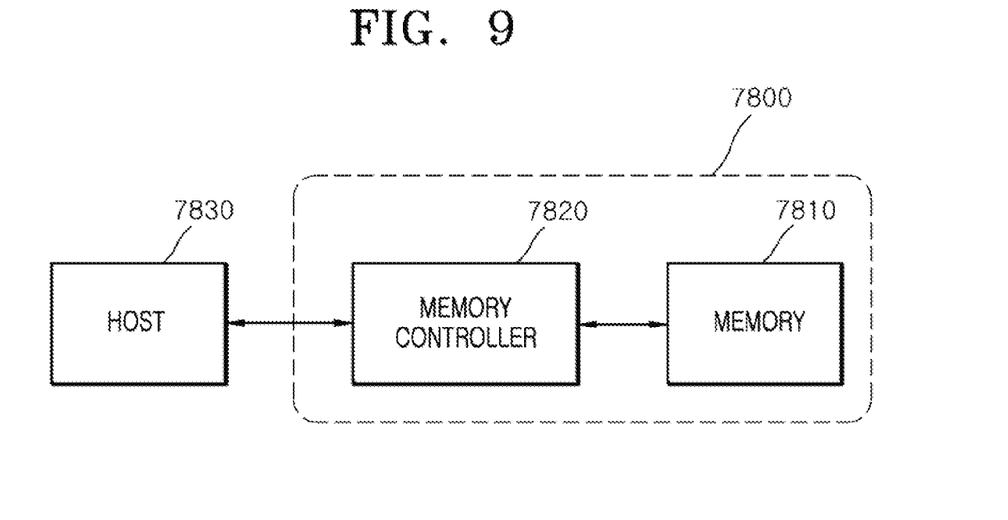
FIG. 9 is a block diagram illustrating an electronic system employing a memory card including at least one stack package according to an embodiment.

FIG. 9 is a block diagram illustrating an electronic system including a memory card 7800 employing at least one stack package according to an embodiment. The memory card 7800 includes a memory 7810 such as a nonvolatile memory device, and a memory controller 7820. The memory 7810 and the memory controller 7820 may store data or read out the stored data. At least one of the memory 7810 and the memory controller 7820 may include at least one stack package according to an embodiment.

The memory 7810 may include a nonvolatile memory device to which the teachings of the present disclosure are applied. The memory controller 7820 may control the memory 7810 such that stored data is read out or data is stored in response to a read/write request from a host 7830.

Figure 10:
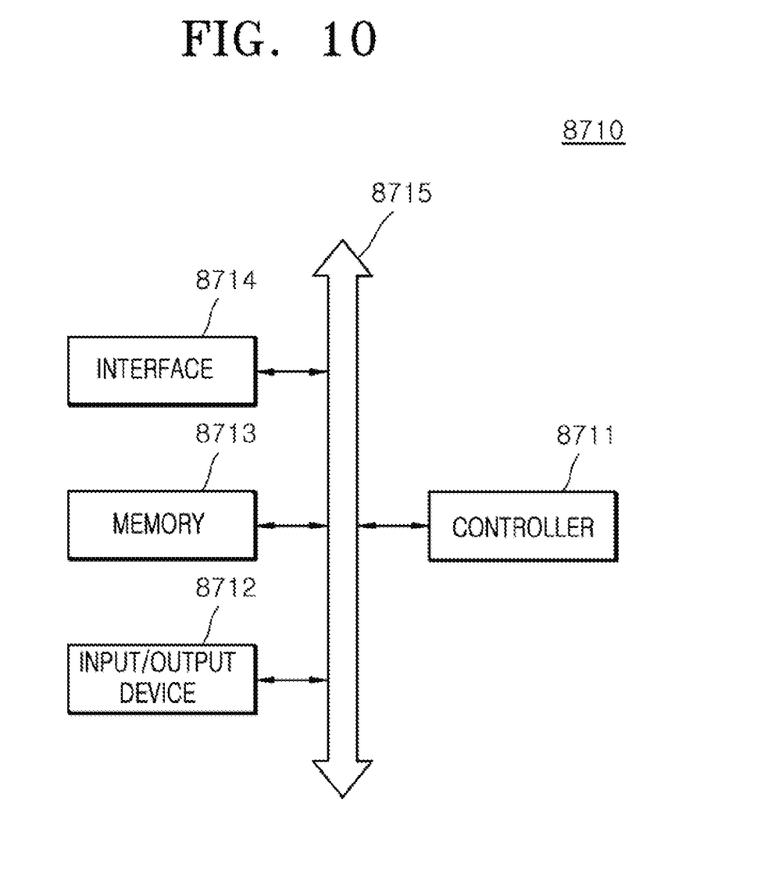
FIG. 10 is a block diagram illustrating another electronic system including at least one stack package according to an embodiment.

FIG. 10 is a block diagram illustrating an electronic system 8710 including at least one stack package according to an embodiment. The electronic system 8710 may include a controller 8711, an input/output unit 8712, and a memory 8713. The controller 8711, the input/output unit 8712, and the memory 8713 may be coupled with one another through a bus 8715 providing a path through which data moves.

In an embodiment, the controller 8711 may include one or more of a microprocessor, digital signal processor, microcontroller, and/or a logic device capable of performing the same functions as these components. The controller 8711 or the memory 8713 may include at least one stack package according to an embodiment of the present disclosure. The input/output unit 8712 may include at least one selected among a keypad, a keyboard, a display device, a touch-screen, and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, then the electronic system 8710 may be used in a communication system using a technique of CDMA (code division multiple access), GSM (global system for mobile communications), NADC (north American digital cellular), E-TDMA (enhanced-time division multiple access), WCDAM (wideband code division multiple access), CDMA2000, LTE (long term evolution), or Wibro (wireless broadband Internet).

Embodiments of the present disclosure have been disclosed for illustrative purposes. Those skilled in the art will appreciate that various modifications, additions, and substitutions are possible, without departing from the scope and spirit of the present disclosure and the accompanying claims.

What is claimed is:
1. A stack package comprising:
a package substrate;
a supporting substrate mounted on the package substrate and supported by first connection bumps and second connection bumps disposed between the supporting substrate and the package substrate;
a first semiconductor die disposed on a first surface of the supporting substrate such that a first surface of the first semiconductor die faces the package substrate;
first redistributed line (RDL) patterns disposed on the first surface of the supporting substrate to electrically connect the first connection bumps to the first semiconductor die;
second RDL patterns disposed on the first surface of the supporting substrate to electrically connect the second connection bumps to the first semiconductor die;
second semiconductor dies stacked on a second surface of the supporting substrate opposite to the first semiconductor die;
third semiconductor dies stacked on the second semiconductor dies;
first bonding wires electrically connected to the second semiconductor dies; and
second bonding wires electrically connected to the third semiconductor dies,
wherein the package substrate comprises:
first wire bond fingers electrically connected to the first bonding wires;
second wire bond fingers electrically connected to the second bonding wires;
first bump bond fingers to which the first connection bumps are electrically connected; and
second bump bond fingers to which the second connection bumps are electrically connected, and
wherein the first and second connection bumps lift the supporting substrate to provide a space in which the first semiconductor die is located between the supporting substrate and the package substrate.
2. The stack package of claim 1,
wherein the second semiconductor dies are stacked to be offset in a first offset direction directed from the first wire bond fingers toward the second wire bond fingers to provide a first step structure;
wherein the third semiconductor dies are stacked to be offset in a second offset direction directed from the second wire bond fingers toward the first wire bond fingers to provide a second step structure; and wherein the second offset direction is an opposite direction of the first offset direction.

3. The stack package of claim 1,
the first wire bond fingers and the second wire bond fingers are located at positions opposite to each other on the package substrate with the supporting substrate and the first semiconductor die therebetween.

4. The stack package of claim 1, wherein the first semiconductor die is disposed above a central portion of the package substrate located between the first wire bond fingers and the second wire bond fingers.

5. The stack package of claim 1, wherein the first and second connection bumps are spaced apart from the first semiconductor die.

6. The stack package of claim 1, wherein the package substrate further comprises:
first interconnection lines respectively and electrically connecting the first wire bond fingers to the first bump bond fingers; and
second interconnection lines respectively and electrically connecting the second wire bond fingers to the second bump bond fingers.

7. The stack package of claim 6, wherein the first semiconductor die comprises:
first die pads respectively and electrically connected to the first RDL patterns; and
second die pads respectively and electrically connected to the second RDL patterns,
wherein the first and second die pads have a width which is less than a diameter of the first and second connection bumps.

8. The stack package of claim 7, further comprising:
first inner bumps electrically connecting the first die pads to the first RDL patterns; and
second inner bumps electrically connecting the second die pads to the second RDL patterns,
wherein the first and second inner bumps are disposed between the first semiconductor die and the first surface of the supporting substrate and have a diameter which is less than a diameter of the first and second connection bumps.

9. The stack package of claim 8,
wherein the first die pads, the first inner bumps, the first RDL patterns, the first connection bumps, the first bump bond fingers, the first interconnection lines, and the first wire bond fingers constitute first electrical paths; and
wherein the second die pads, the second inner bumps, the second RDL patterns, the second connection bumps, the second bump bond fingers, the second interconnection lines, and the second wire bond fingers constitute second electrical paths.

10. The stack package of claim 9, wherein the first electrical paths have the same lengths as the second electrical paths, respectively.

11. The stack package of claim 7, wherein the first die pads of the first semiconductor die are arrayed in two columns along edges of the first semiconductor die in a zigzag pattern.

12. The stack package of claim 11, wherein the first connection bumps are arrayed in two columns in a zigzag pattern to correspond to the first die pads arrayed in two columns in a zigzag pattern.

13. The stack package of claim 7, wherein the first connection bumps are disposed to have a pitch which is greater than a pitch of the first die pads.

14. The stack package of claim 13, wherein the first wire bond fingers are disposed to have a pitch which is less than a pitch of the first connection bumps.

15. The stack package of claim 7, wherein the first and second die pads are disposed along edges of the first semiconductor die in a loop pattern.

16. The stack package of claim 7,
wherein the first and second die pads are disposed on the first surface of the first semiconductor die;
wherein the first die pads are symmetric to the second die pads on the first surface of the first semiconductor die;
wherein the first connection bumps are disposed to be symmetric to the second connection bumps with respect to a centerline of the first semiconductor die; and
wherein the first wire bond fingers are disposed to be symmetric to the second wire bond fingers with respect to the centerline of the first semiconductor die.

17. The stack package of claim 1, wherein the first semiconductor die has a size which is less than a size of the second semiconductor dies.

18. The stack package of claim 1, wherein the supporting substrate has a size which is substantially equal to or greater than a size of a second bottommost semiconductor die which is stacked to be closest to the second surface of the supporting substrate among the second semiconductor dies.

19. The stack package of claim 18, wherein the second bottommost semiconductor die is disposed to fully overlap with the supporting substrate.

20. A stack package comprising:
a package substrate;
a supporting substrate mounted on the package substrate and supported by first connection bumps and second connection bumps disposed between the supporting substrate and the package substrate;
a first semiconductor die disposed on a first surface of the supporting substrate to face the package substrate;
first redistributed line (RDL) patterns disposed on the first surface of the supporting substrate to electrically connect the first connection bumps to the first semiconductor die;
second RDL patterns disposed on the first surface of the supporting substrate to electrically connect the second connection bumps to the first semiconductor die;
second semiconductor dies stacked on a second surface of the supporting substrate opposite to the first semiconductor die; and
bonding wires electrically connecting the second semiconductor dies to the package substrate,
wherein the first and second connection bumps lift the supporting substrate to provide a space in which the first semiconductor die is located between the supporting substrate and the package substrate.

* * * * *